United States Patent [19]

Piosenka et al.

[11] Patent Number: 4,611,183

[45] Date of Patent: Sep. 9, 1986

[54] DIGITAL DECORRELATING RANDOM DATA GENERATOR

[75] Inventors: Gerald V. Piosenka, Scottsdale; Barry B. Mead, Mesa, both of Ariz.

[73] Assignee: Motorola, Inc., Schaumburg, Ill.

[21] Appl. No.: 605,366

[22] Filed: Apr. 30, 1984

[51] Int. Cl.$^4$ ............................................. H03B 29/00
[52] U.S. Cl. ...................................... 331/78; 364/717
[58] Field of Search ..................... 331/78; 364/717; 328/14, 28, 59, 60, 61, 158

[56] References Cited

U.S. PATENT DOCUMENTS

| | | | |
|---|---|---|---|
| 3,778,722 | 12/1973 | Stein | 325/414 |
| 3,855,555 | 12/1974 | Burkhard et al. | 332/11 D |
| 4,156,871 | 5/1979 | Lambourn | 340/347 AD |
| 4,395,703 | 7/1983 | Piosenka | 340/347 AD |
| 4,535,466 | 8/1985 | Palvolgyi | 377/54 |
| 4,545,024 | 10/1985 | Maher et al. | 364/717 |

*Primary Examiner*—Eugene R. LaRoche
*Assistant Examiner*—D. C. Mis
*Attorney, Agent, or Firm*—Raymond J. Warren

[57] ABSTRACT

An apparatus and method is disclosed that provides a random data generator that is less susceptible to error sources resulting from negative feedback biasing. This invention utilizes a shift register and a multiplexer, controlled by the shift register, to provide the feedback to an amplifier. This improves the correlation between the present data output bit and the following bit.

28 Claims, 6 Drawing Figures

— PRIOR ART —

DIGITAL DECORRELATING RANDOM DATA GENERATOR

BACKGROUND OF THE INVENTION

1. Field of the Invention

This invention relates, in general, to an electronic device for generating random data and, more particularly, to a random data generator with improved statistical properties.

2. Background Art

The closest known background art to the present invention is U.S. Pat. No. 4,395,703 issued 26 July 1983 to the same inventor. Patent '703, while an improvement over the prior art at the time, has the drawbacks of being subject to error sources which degrade the statistical properties of the random data output. These error sources include significant leakage currents from the capacitors required to operate the device and negative feedback which influences subsequent bits.

SUMMARY OF THE INVENTION

Accordingly, it is an object of the present invention to provide an apparatus and method that is less susceptible to error sources as a result of having enhanced statistical properties.

A further object of the present invention is to provide an apparatus and method reducing the time constants required for the circuit to reach a quiescent level.

Still another object of the present invention is to provide an apparatus and method of reducing the negative feedback of the device which may cause error in subsequent bits.

Yet another object of the present invention is to provide an apparatus and method which does not require the use of a matched pair of flip flops.

The above and other objects and advantages of the present invention are provided by an apparatus and method of removing sources of monobit balance error and decorrelating influence of output data bits on future bits by amplifying a low level analog noise to a synchronous digital output stream with an amplifier that does not distort the statistical properties of the noise source.

A particular embodiment of the present invention comprises an apparatus and method of using a single flip flop to control an amplifier, and using previous data bits output into a serial register to control the biasing of a comparator.

DETAILED DESCRIPTION OF THE INVENTION

Figure 1:
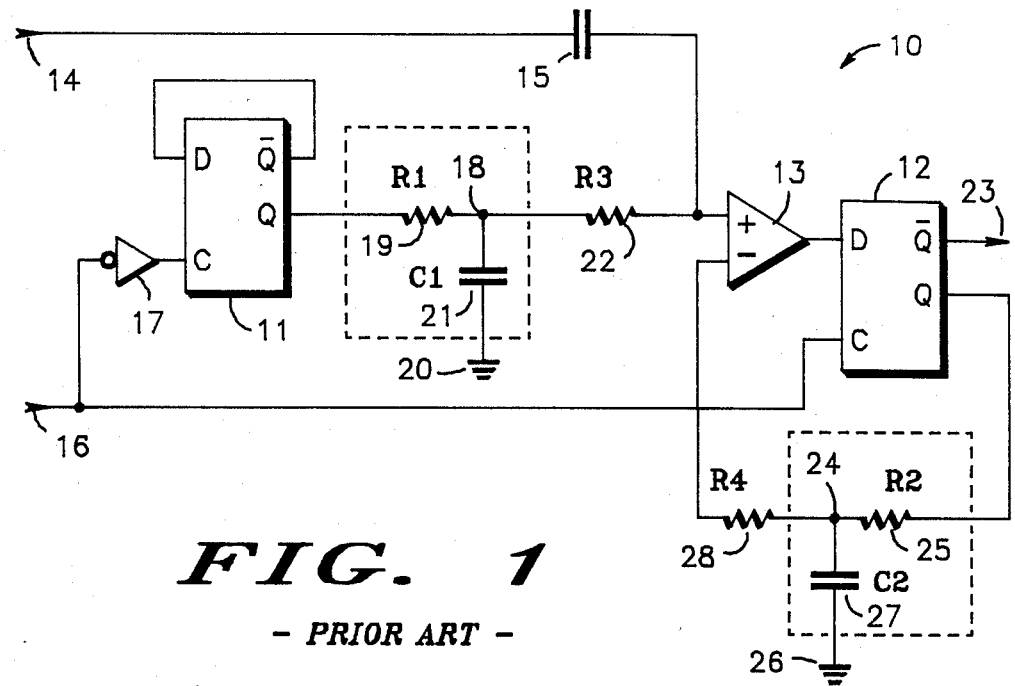
FIG. 1 is a block diagram of a prior art randomizer.

Referring to the diagram of FIG. 1 a prior art randomizer, generally designated 10, is illustrated. Randomizer 10 has two flip flops, 11 and 12, and a comparator 13. A noise signal is received at a node 14 and transmitted through a capacitor 15 to the "+" input of comparator 13. A clock signal is received by randomizer 10 at a node 16. Node 16 is coupled to the C input of flip flop 12 and inverted and coupled to the input of a driver 17. The output of driver 17 is coupled to the C input of flip flop 11. The $\overline{Q}$ output of flip flop 11 is coupled to the D input of flip flop 11. The Q output of flip flop 11 is coupled to a node 18 through a resistor 19. Node 18 is coupled to a ground node 20 through a capacitor 21 and to the "+" input of comparator 13 through a resistor 22. The output of comparator 13 is coupled to the D input of flip flop 12. The $\overline{Q}$ output of flip flop 12 is coupled to an output node 23. The Q output of flip flop 12 is coupled to a node 24 through a resistor 25. Node 24 is coupled to a ground node 26 through a capacitor 27 and to the "−" input of comparator 13 through a resistor 28. Flip flops 11 and 12 are required to be on a common integrated circuit to provide identical operating characteristics.

Flip flop 11 is operated in a divide-by-two configuration to produce a square wave output having a perfect monobit balance (equal numbers of logic ones and zeroes are created). Resistor 19 and capacitor 21 operate as a low pass filter and are selected to have a time constant much larger than the clock signal entered at node 6. This results in the voltage level at node 18 being a DC level with a very small ripple voltage. The DC level at node 18 is the same as an identical flip flop would produce if its output had perfect monobit balance. This concept is used, along with having flip flop 12 on the same chip as flip flop 11, to produce a digital data output at node 23 having perfect monobit balance. The voltage at node 24 is identical to that at node 18. If the voltages are not identical the amplifying medium is misbiased resulting in a skewing of the statistical properties in the amplified signal from those presented by the low level analog noise source. The voltage at nodes 18 and 24 are provided as "+" and "−" inputs, resp., to comparator 13 through resistors 22 and 28, resp. The voltage at node 24 is feedback in a negative sense so as to automatically correct for bias errors. This circuit, while an improvement over the prior art, still has several sources of error which will impact the monobit balance. First, the time constant of resistor 19 and capacitor 21, and resistor 25 and capacitor 27 are generally large in order to reduce the AC ripple voltage at nodes 18 and 24, resp. Resistors 19 and 25 cannot be made arbitrarily high since error voltages would develop due to comparator input offset currents. Capacitors 21 and 27 are in general tantalum capacitors which have significant leakage currents. The leakage currents flowing through resistors 19 and 25 create an offset error voltage which affects the monobit balance.

Figure 2:
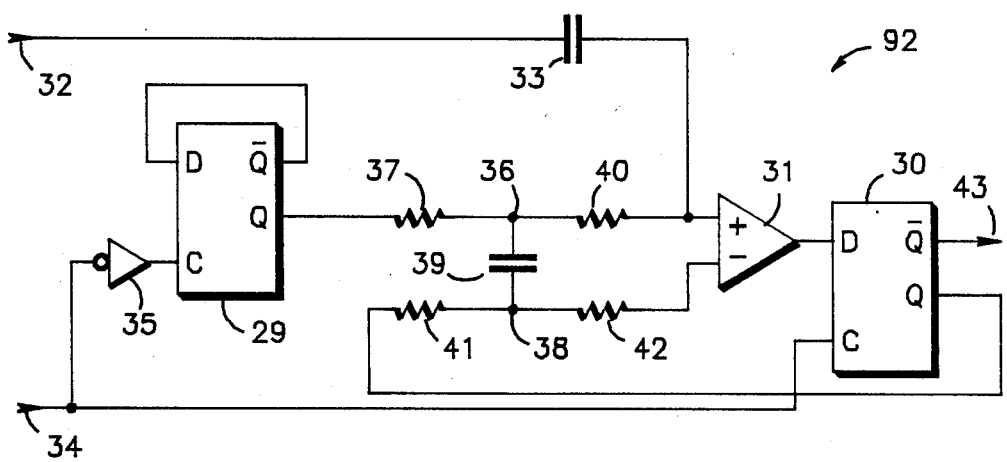
FIG. 2 is a block diagram of a randomizer embodying the present invention having a floating integrator.

This source of error is eliminated by utilization of a differential integrator. Referring now to FIG. 2 a randomizer, generally designated 92, is illustrated embodying the present invention. Randomizer 92 has two flip flops, 29 and 30, and a comparator 31. Randomizer 92 has an input node 32 coupled to receive a noise signal. Node 32 is coupled to the "+" input of comparator 31 through a capacitor 33. A clock signal is input to randomizer 92 at a node 34. Node 34 is coupled to the clock input of flip flop 30 and is inverted and coupled to the input of a driver 35. The output of driver 35 is coupled to the clock input of flip flop 29. The Q output of flip flop 29 is coupled to the D input of flip flop 29. The $\overline{Q}$ output of flip flop 29 is coupled to a node 36 through a resistor 37. Node 36 is coupled to a node 38 through a capacitor 39 and to the "+" input of comparator 31 through a resistor 40. Node 38 is coupled to the Q output of flip flop 30 through a resistor 41 and to the "−" input of comparator 31 through a resistor 42. The output of comparator 31 is coupled to the D input of flip flop 30. Output $\bar{Q}$ of flip flop 30 is coupled to an output node 43 of randomizer 92.

In FIG. 2 the DC level across capacitor 39 is zero volts. This results from the DC voltages at nodes 36 and 38 being equal. Nodes 36 and 38 have equal voltage since they both have a monobit output from two flip flops, 29 and 30, that are formed on the same substrate. In addition coupling nodes 36 and 38 with capacitor 39 further causes a balance of the DC voltages at these nodes. This equal voltage will be more evident in FIG. 3 below. Since the leakage current is a function of the applied voltage, the DC leakage current is zero. This circuit, therefore, does not create the offset voltage as in FIG. 1.

The prior art circuit of FIG. 1 has the additional problem of having large time constants which require the circuit not be used until the voltage at nodes 18 and 24 attain their quiescent levels. This limitation is inconvenient and requires the use of special delay circuitry. The circuit of FIG. 2 does not have this requirement as the voltage across capacitor 39 is zero.

The prior art circuit of FIG. 1 further requires the use of two matched flip flops 11 and 12. While this is not a problem it is not economical to use a circuit that may be used elsewhere.

Figure 3:
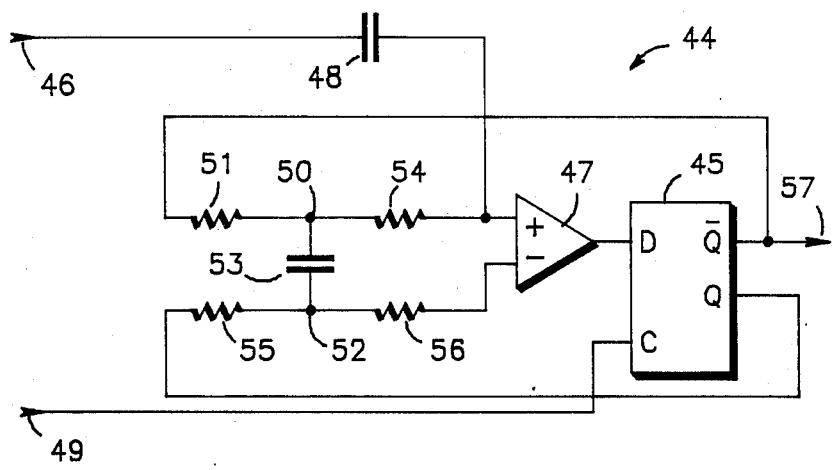
FIG. 3 is a block diagram of a randomizer embodying the present invention utilizing a single flip flop.

Referring now to FIG. 3 a randomizer, generally designated 44, embodying the present invention is illustrated. Randomizer 44 has a flip flop 45 having Q and $\bar{Q}$ outputs which have essentially identical characteristics. This eliminates the need for a reference flip flop. Randomizer 44 receives a noise signal at a node 46 which is coupled to the "+" input of comparator 47 through a capacitor 48. Randomizer 44 also receives a clock signal at a node 49 which is coupled to the clock input of flip flop 45. The $\bar{Q}$ output of flip flop 45 is coupled to a node 50 through a resistor 51. Node 50 is also coupled to a node 52 through a capacitor 53 and to the "+" input of comparator 47 through a resistor 54. Node 52 is coupled to the Q output of flip flop 45 through a resistor 55 and to the "−" input of comparator 47 through a resistor 56. Randomizer 44 has an output node 57 coupled to the $\bar{Q}$ output of flip flop 45. In this circuit the Q and $\bar{Q}$ outputs of flip flop 45 drive the differential integrator which in turn biases the amplifier. If the output does not produce a waveform with long term 50% monobit balance, then the bias is adjusted by the integrator to drive the circuit to balance.

As discussed in FIG. 2, and accompanying text, the DC level across capacitor 53 is zero volts because the DC voltages at nodes 50 and 52 are equal. Here the outputs of one flip flop provide the voltages at nodes 50 and 52. Although the voltages are opposite they do have the same average voltage as a result of the monobit output.

The circuits of FIGS. 2 and 3 provide improvements relative to the monobit balance but do not provide enhancement for the $\Delta 1$ statistic which is a measure of the correlation between a present data output bit and the following bit. The problem here is caused by the negative feedback employed. While the integrator removes most of the ripple voltage a small amount remains at the comparator input. This ripple voltage influences the subsequent logic bit. While this ripple voltage is minimal, for very high quality random data generators the influence is unacceptable.

Figures 4, 5:
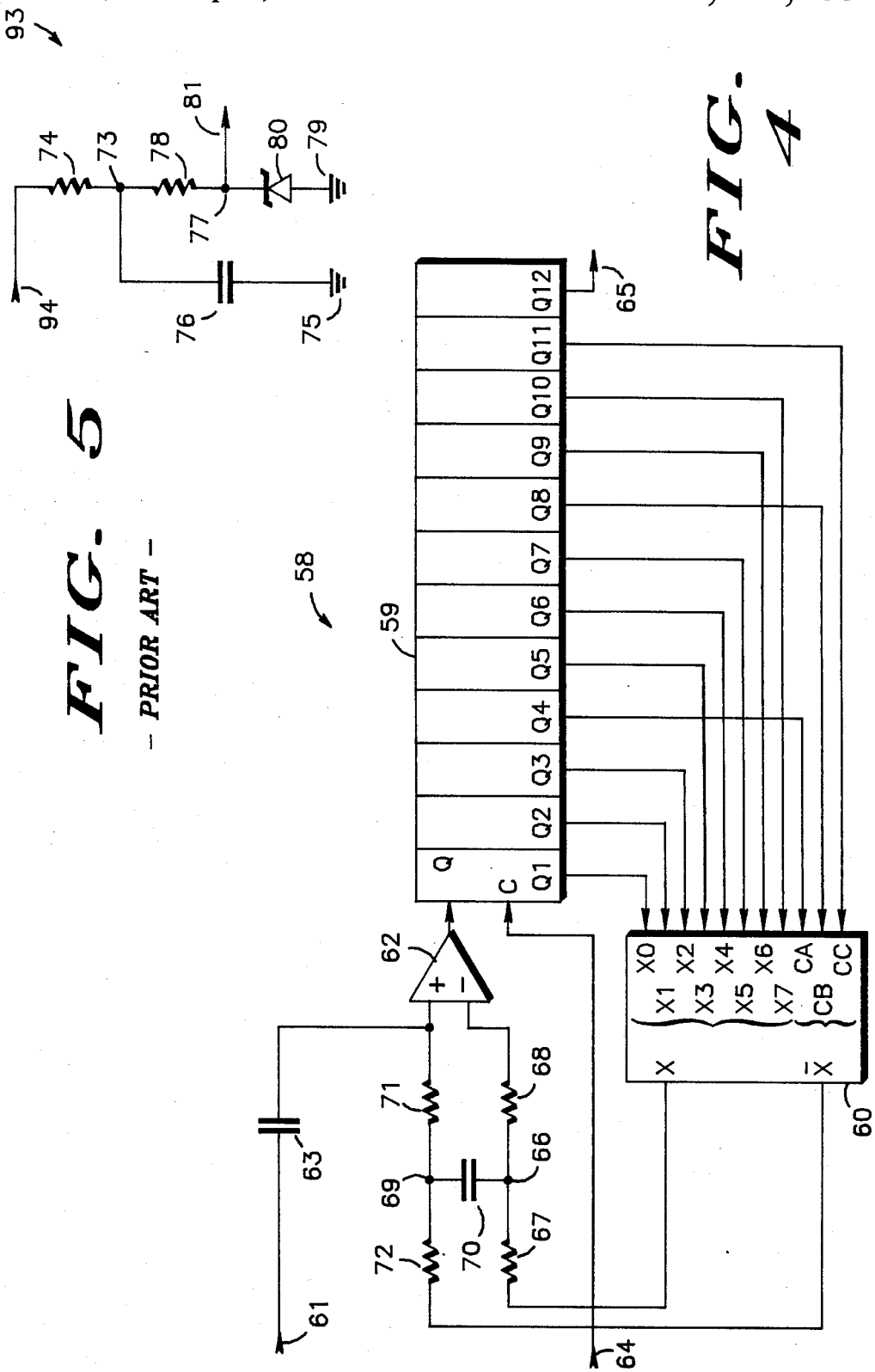
FIG. 4 is a block diagram of a randomizer embodying the present invention using a feedback circuit.
FIG. 5 is a schematic diagram of a prior art noise generator.

Referring now to FIG. 4 a randomizer, generally designated 58, is illustrated embodying the present invention. A serial shift register 59 is used in conjunction with an 8 to 1 data multiplexer 60 to replace the single flip flop previously used in FIG. 3. Randomizer 58 receives a noise signal at a node 61. Node 61 is coupled to the "+" input of a comparator 62 through a capacitor 63. Randomizer 58 also receives a clock input at a node 64 which is coupled to the clock input of shift register 59. Shift register 59 has an output bus of length K connected to an input bus of multiplexer 60 and a data output coupled to an output node 65. The bus line between shift register 59 and multiplexer 60 is divided into a data bus of M length and a control bus of N length where M and N are defined by the equations: $M+N=K$ and $2^N=M$. Multiplexer 60 has an output X coupled to a node 66 through a resistor 67. Node 66 is also coupled to the "−" input of comparator 62 through a resistor 68 and to a node 69 through a capacitor 70. Node 69 is also coupled to the "+" input of comparator 62 through a resistor 71 and to the $\bar{X}$ output of multiplexer 60 through a resistor 72.

In FIG. 4 the M bits serve as input to multiplexer 60 and the N bits are used to control the data selector to provide for selection of one of the M bits as the X output of multiplexer 60. The N bits controlling the selector provide for a random selection of the feedback bit when the statistics of the comparator output exhibit perfect monobit balance. When the monobit balance is not perfect, selection of the feedback bit is biased but is a significant improvement over a fixed feedback method. While a ripple voltage is still present at comparator 62, the ability to predict or correlate any given bit in the sequence based on any other bit in the sequence is dramatically reduced. The selection for the M and N bits is arbitrary, however the N bits used for control of multiplexer 60 should be selected such that they are not adjacent in the register. This provides for all of the N bits to change on each clock cycle as a new bit is shifted in. Here the N bits were selected from flip flops 11, 8 and 4 of shift register 59.

Referring now to FIG. 5 a prior art noise diode circuit, generally designated 93, is illustrated. Circuit 93 has an input node 94 coupled to a voltage supply. Node 94 is then coupled to a node 73 through a resistor 74. Node 73 is coupled to a ground node 75 through a capacitor 76 and to a node 77 through a resistor 78. Node 77 is coupled to a ground node 79 through an avalanche diode 80 and to a noise signal output node 81. In the present invention decoupling of the noise diode is imperative since any correlatable signals present on the power source may produce a modulating voltage on diode 80 and be amplified by the circuit, corrupting the resulting random data.

Figure 6:
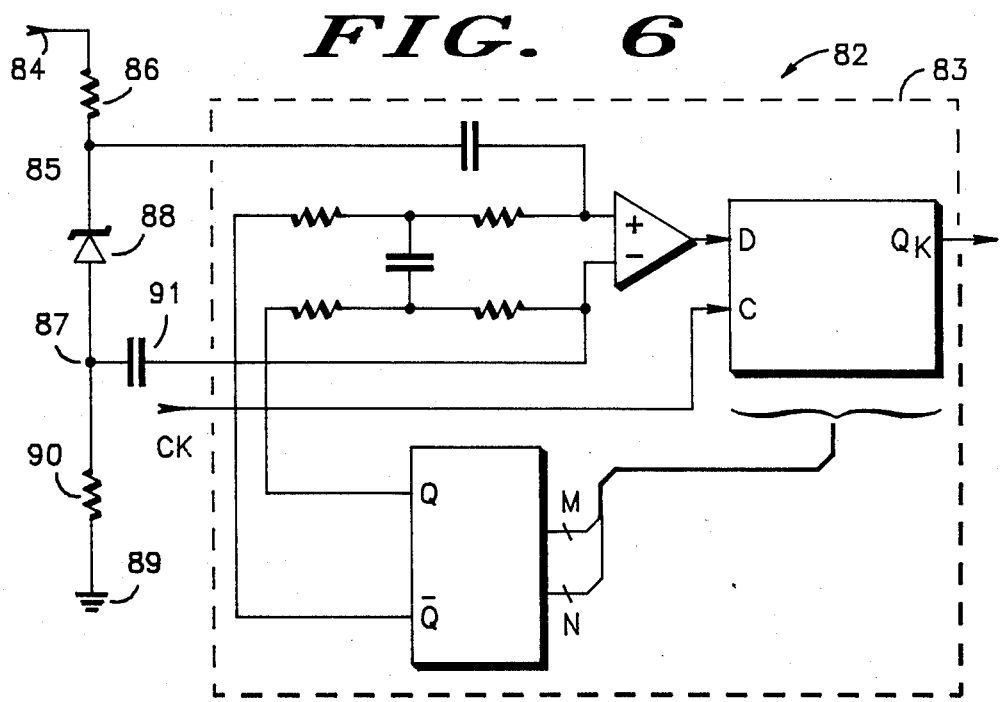
FIG. 6 is a block diagram of a randomizer embodying the present invention illustrating a differentially coupled noise circuit.

In FIG. 6 a block diagram of a randomizer generally designated 82, is illustrated which utilizes a differentially coupled noise source. A noise source is coupled to randomizer 83, described in the text accompanying FIG. 4. The noise source has a node 84 coupled to receive an input voltage. Node 84 is coupled to a node 85 through a resistor 86. Node 85 is coupled to the noise input of randomizer 83, see FIG. 4, and to a node 87 through a diode 88. Node 87 is coupled to a ground node 89 through a resistor 90 and is coupled to the "−"

input of the comparator of randomizer 83 through a capacitor 91. By differentially coupling the noise voltage generated across the diode a common mode voltage presented by the power source appears at the positive and negative inputs of the amplifier and is thereby reduced by the common mode rejection of the amplifier. In FIG. 6 R1=R2; R3=R4; R5=R6 and C2=C3.

Thus, it is apparent that there has been provided, in accordance with the invention, a device and method that fully satisfies the objects, aims, and advantages set forth above.

It has been shown that the present invention provides a randomizer that is less susceptible to error sources as a result of having improved statistical properties.

While the invention has been described in conjunction with specific embodiments thereof, it is evident that many alterations, modifications and variations will be apparent to those skilled in the art in light of the foregoing description. Accordingly, it is intended to embrace all such alternatives, modifications, and variations as fall within the spirit and broad scope of the appended claims.

We claim:

1. A randomizer device, having a noise input, a clock input and an output, said randomizer comprising:
    feedback means for producing a feedback signal, said feedback means having an input, a clock input, a first output, a second output and a third output, said clock input being coupled to said clock input of said randomizer device and said third output being coupled to said output of said randomizer device;
    a comparator having a first input, a second input and an output, said first input being coupled to said noise input of said randomizer means and said output being coupled to said input of said feedback means; and
    coupling means for coupling said first and second inputs of said comparator providing a balanced DC voltage and reducing the ripple voltage to said comparator, said coupling means having a first input, a second input, a first output and a second output, said first input being coupled to said first output of said feedback means, said second input being coupled to said second output of said feedback means, said first output being coupled to said first input of said comparator and said second output being coupled to said second input of said comparator.

2. The randomizer device of claim 1 wherein said first input of said comparator is coupled to said noise input of said randomizer device through a first capacitor.

3. The randomizer device of claim 2 wherein said coupling means comprises:
    a first resistor having a first connector and a second connector, said second connector being coupled to said first output of said coupling means;
    a second resistor having a first connector and a second connector, said second connector being coupled to said first connector of said first resistor and said first connector being coupled to said first input of said coupling means;
    a second capacitor having a first connector and a second connector, said first connector being coupled to said second connector of said second resistor;
    a third resistor having a first connector and a second connector, said second connector being coupled to said second connector of said second capacitor and said first connector being coupled to said second input of said coupling means; and
    a fourth resistor having a first connector and a second connector, said first connector being coupled to said second connector of said third resistor and said second connector being coupled to said second output of said coupling means.

4. The randomizer device of claim 3 wherein said feedback means comprises:
    a shift register having an input, a clock input, an output, a first bus output and a second bus output, said input being coupled to said input of said feedback means, said clock input being coupled to said clock input of said feedback means, and said output being coupled to said output of said feedback means;
    a multiplexer having a first data bus input, a second data bus input, a first output and a second output, said first data bus input being coupled to said first data bus output of said shift register, said second data bus input being coupled to said second data bus output of said shift register, said first output being coupled to said first output of said feedback means and said second output being coupled to said second output of said feedback means.

5. The randomizer device of claim 4 wherein said first resistor is equal to said fourth resistor.

6. The randomizer device of claim 5 wherein said second resistor equals said third resistor.

7. The randomizer device of claim 6 which further comprises noise generating means, having an input and a ground, said noise generating means comprises:
    a fifth resistor having a first connector and a second connector, said first connector being coupled to said input of said noise generating means and said second connector being coupled to said noise input of said randomizer device;
    a diode having an input and an output, said output being coupled to said second connector of said fifth resistor;
    a sixth resistor having a first connector and a second connector, said first connector being coupled to said input of said diode and said second connector being coupled to said ground of said noise generating means; and
    a third capacitor having a first connector and a second connector, said first connector being coupled to said first connector of said sixth resistor and said second connector being coupled to said second input of said comparator.

8. The randomizer device of claim 7 wherein said fifth resistor equals said sixth resistor.

9. The randomizer device of claim 8 wherein said first capacitor equals said third capacitor.

10. The randomizer device of claim 3 wherein said feedback means comprises a flip flop having an input, a clock input, a first output and a second output, said input being coupled to said input of said feedback means, said clock input being coupled to said clock input of said feedback means, said first output being coupled to said first output of said feedback means, said first output being coupled to said third output of said feedback means and said second output being coupled to said second output of said feedback means.

11. The randomizer device of claim 10 wherein said first resistor is equal to said fourth resistor.

12. The randomizer device of claim 11 wherein said second resistor equals said third resistor.

13. The randomizer device of claim 12 which further comprises noise generating means, having an input and a ground, said noise generating means comprises:
- a fifth resistor having a first connector and a second connector, said first connector being coupled to said input of said noise generating means and said second connector being coupled to said noise input of said randomizer device;
- a diode having an input and an output, said output being coupled to said second connector of said fifth resistor;
- a sixth resistor having a first connector and a second connector, said first connector being coupled to said input of said diode and said second connector being coupled to said ground of said noise generating means; and
- a third capacitor having a first connector and a second connector, said first connector being coupled to said first connector of said sixth resistor and said second connector being coupled to said second input of said comparator.

14. The randomizer device of claim 13 wherein said fifth resistor equals said sixth resistor.

15. The randomizer device of claim 14 wherein said first capacitor equals said third capacitor.

16. The randomizer device of claim 3 wherein said feedback means comprises:
- a first flip flop having an input, a clock input, a first output and a second output, said input being coupled to said input of said feedback means, said clock input being coupled to said clock input of said feedback means, said first output being coupled to said third output of said feedback means and said second output being coupled to said first output of said feedback means;
- a second flip flop having an input, a clock input, a first output and a second output, said input being coupled to said first output of said second flip flop and said second output being coupled to said second output of said feedback means;
- a logic circuit having an input and an output, said input being coupled to said clock input of said feedback means and said output being coupled to said clock input of said second flip flop.

17. The randomizer device of claim 16 wherein said first resistor is equal to said fourth resistor.

18. The randomizer device of claim 17 wherein said second resistor equals said third resistor.

19. The randomizer device of claim 18 which further comprises noise generating means, having an input and a ground, said noise generating means comprises:
- a fifth resistor having a first connector and a second connector, said first connector being coupled to said input of said noise generating means and said second connector being coupled to said noise input of said randomizer device;
- a diode having an input and an output, said output being coupled to said second connector of said fifth resistor;
- a sixth resistor having a first connector and a second connector, said first connector being coupled to said input of said diode and said second connector being coupled to said ground of said noise generating means; and
- a third capacitor having a first connector and a second connector, said first connector being coupled to said first connector of said sixth resistor and said second connector being coupled to said second input of said comparator.

20. The randomizer device of claim 19 wherein said fifth resistor equals said sixth resistor.

21. The randomizer device of claim 20 wherein said first capacitor equals said third capacitor.

22. A method of producing a random data signal comprising the steps of:
- providing a noise signal to a randomizer;
- amplifying said noise signal using a comparator producing an amplified signal;
- transmitting said amplified signal to a shift register;
- storing said amplified signal in said shift register making a store signal;
- transmitting a first portion of said stored signal to a data input of a multiplexer and a second portion of said stored signal to a control input of said multiplexer;
- selecting an output of said multiplexer using said second portion of said stored signal transmitted to said control input of said multiplexer; and
- biasing said comparator with said output from said multiplexer.

23. A randomizer device, having an input, a clock input and an output, comprising:
- a first capacitor having a first connector and a second connector, said first connector being coupled to said input of said randomizer device;
- a first resistor having a first connector and a second connector, said second connector being coupled to said second connector of said first capacitor;
- a second resistor having a first connector and a second connector, said second connector being coupled to said first connector of said first resistor;
- a second capacitor having a first connector and a second connector, said first connector being coupled to said first connector of said first resistor;
- a third resistor having a first connector and a second connector, said second connector being coupled to said second connector of said second capacitor;
- a fourth resistor having a first connector and a second connector, said first connector being coupled to said second connector of said second capacitor;
- a comparator having a first input, a second input and an output, said first input being coupled to said second connector of said first capacitor and said second input being coupled to said second connector of said fourth resistor;
- a shift register having an input, a clock input, an output, a first bus and a second bus, said input being coupled to said output of said comparator, said clock input being coupled to said clock input of said randomizer and said output being coupled to said output of said randomizer;
- a multiplexer having a data input, a control input, a first output and a second output, said data input being coupled to said first data bus of said shift register, said control input being coupled to said second data bus of said shift register, said first output being coupled to said first connector of said second resistor and said second output being coupled to said first connector of said third resistor.

24. The randomizer device of claim 23 wherein said first resistor is equal to said fourth resistor.

25. The randomizer device of claim 24 wherein said second resistor equals said third resistor.

26. The randomizer device of claim 25 which further comprises a noise generator having:
- a fifth resistor having a first connector and a second connector, said first connector being coupled to an input voltage and said second connector being coupled to an input of said randomizer device;
- a diode having an input and an output, said output being coupled to said second connector of said fifth resistor;
- a sixth resistor having a first connector and a second connector, said first connector being coupled to said input of said diode and said second connector being coupled to a ground point;
- a third capacitor having a first connector and a second connector, said first connector being coupled to said first connector of said sixth resistor and said second connector being coupled to said second input of said comparator.

27. The randomizer device of claim 26 wherein said fifth resistor equals said sixth resistor.

28. The randomizer device of claim 27 wherein said first capacitor equals said third capacitor.

* * * * *